(12) United States Patent
Sekiya

(10) Patent No.: US 10,460,974 B2
(45) Date of Patent: Oct. 29, 2019

(54) WAFER PROCESSING METHOD AND ADHESIVE TAPE

(71) Applicant: DISCO CORPORATION, Tokyo (JP)

(72) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 9 days.

(21) Appl. No.: 15/867,263

(22) Filed: Jan. 10, 2018

(65) Prior Publication Data

US 2018/0197765 A1   Jul. 12, 2018

(30) Foreign Application Priority Data

Jan. 11, 2017   (JP) .................................. 2017-002340

(51) Int. Cl.

| | |
|---|---|
| *H01L 21/683* | (2006.01) |
| *H01L 21/78* | (2006.01) |
| *H01L 21/66* | (2006.01) |
| *B23K 26/06* | (2014.01) |
| *B23K 26/38* | (2014.01) |
| *B23K 26/03* | (2006.01) |

(52) U.S. Cl.
CPC ........ *H01L 21/6836* (2013.01); *B23K 26/032* (2013.01); *B23K 26/0626* (2013.01); *B23K 26/38* (2013.01); *H01L 21/78* (2013.01); *H01L 22/12* (2013.01); *H01L 22/20* (2013.01); *H01L 22/26* (2013.01); *H01L 2221/68327* (2013.01)

(58) Field of Classification Search
CPC ................. H01L 21/6836; H01L 21/78; H01L 2221/68327; H01L 2221/68336; H01L 22/26; H01L 22/20; H01L 22/12; B23K 26/38; B23K 26/362; B23K 26/364; B23K 26/032; B23K 26/0626
See application file for complete search history.

(56) References Cited

U.S. PATENT DOCUMENTS

| | | | | |
|---|---|---|---|---|
| 9,174,305 | B2* | 11/2015 | Morikazu | ......... H01L 21/67092 |
| 9,700,961 | B2* | 7/2017 | Kitahara | ................. H01L 21/78 |
| 2009/0127233 | A1* | 5/2009 | Asano | .................. B23K 26/032 |
| | | | | 219/121.7 |
| 2016/0199940 | A1* | 7/2016 | Nomaru | ............ H01L 21/76898 |
| | | | | 219/121.62 |

FOREIGN PATENT DOCUMENTS

| | | | |
|---|---|---|---|
| JP | 08-088202 | | 4/1996 |
| JP | 2004-188475 A | | 7/2004 |
| JP | 2014-130910 A | * | 7/2014 |

* cited by examiner

*Primary Examiner* — Michael M Trinh
(74) *Attorney, Agent, or Firm* — Greer Burns & Crain, Ltd.

(57) ABSTRACT

Disclosed is a wafer processing method for dividing a wafer into individual chips by applying to the wafer a laser beam having such a wavelength as to be absorbed in the wafer. The wafer processing method includes: an adhesive tape attaching step of attaching to the wafer an adhesive tape that emits plasma light different from plasma light emitted by the wafer upon application of a laser light thereto; a holding step of holding the adhesive tape side on the chuck table so as to expose the wafer; a dividing step of dividing the wafer while relatively moving the chuck table and the laser beam; and a plasma light detection step of detecting the plasma light generated at the time of the dividing step.

4 Claims, 3 Drawing Sheets

WAFER PROCESSING METHOD AND ADHESIVE TAPE

BACKGROUND OF THE INVENTION

Field of the Invention

The present invention relates to a wafer processing method for dividing a wafer into individual chips by applying a laser beam to the wafer, and an adhesive tape.

Description of the Related Art

A wafer with a plurality of devices such as integrated circuits (ICs) and large-scale integration (LSI) formed on its front surface partitioned by division lines (streets) is divided into individual chips by a dicing apparatus or a laser processing apparatus, and the thus divided chips are used for electric apparatuses such as mobile phones, personal computers and TV sets. The dicing apparatus positions a cutting blade to the division line of the wafer held on a chuck table to cut and divide the wafer into individual chips, and, in this case, by controlling the cutting depth of the cutting blade, complete cutting of the wafer can be performed while leaving part of the adhesive tape uncut (see, for example, Japanese Patent Laid-open No. Hei 08-088202).

In addition, there has also been known a laser processing method in which instead of using a cutting blade, a laser beam is applied to the wafer with a focal point of the laser beam positioned at the division line of the wafer and, while applying the laser beam, the wafer is moved relative to the laser beam, thereby dividing the wafer into individual chips. According to this method, the division lines can be made smaller in width, whereby the number of chips obtained from one sheet of wafer can be increased and, thus, enhanced production efficiency has been realized (see, for example, Japanese Patent Laid-open No. 2004-188475).

SUMMARY OF THE INVENTION

According to the wafer processing method described in Japanese Patent Laid-open No. Hei 08-088202, by controlling the height position of the lower tip portion of the cutting blade, division of the wafer into individual chips can be easily realized. On the other hand, in the configuration in which the wafer is divided into individual chips by applying a laser beam to the wafer as described in Japanese Patent Laid-open No. 2004-188475, it is impossible to easily set the processing depth, and it is difficult to easily determine during processing whether or not the wafer has been completely cut. When it is found after the processing is finished that the processing has been incomplete, it is necessary to control the output of the laser beam and then perform the laser processing again. Thus, this method has had the problem of poor productivity.

In addition, in the case where the adhesive tape for supporting the wafer is to be partly left uncut while performing complete cutting of only the wafer, it is desired to finely control the output of the laser beam. However, it is difficult to determine, on a real-time basis, whether or not complete division has been made by application of the laser beam. Therefore, it is found only after the processing is over that the division has been incomplete. Thus, the processing must be performed again.

Accordingly, it is an object of the present invention to provide a wafer processing method by which it is possible to confirm whether or not complete cutting of a wafer has been made, during the processing of the wafer by application of a laser beam.

In accordance with an aspect of the present invention, there is provided a wafer processing method for dividing a wafer into individual chips by applying to the wafer a laser beam having such a wavelength as to be absorbed in the wafer, the laser processing method including: an adhesive tape attaching step of attaching the wafer to an adhesive tape that emits plasma light different from plasma light emitted by the wafer upon application of a laser beam thereto; a holding step of holding the adhesive tape side on a chuck table so as to expose the wafer, after performing the adhesive tape attaching step; a dividing step of diving the wafer while relatively moving the chuck table and the laser beam, after performing the holding step; and a plasma light detection step of detecting plasma light generated at the time of the dividing step. In the plasma light detection step, complete division of the wafer is confirmed by detecting plasma light generated upon application of the laser beam to the adhesive tape.

In accordance with another aspect of the present invention, there is provided an adhesive tape to be used by attaching a wafer thereto when dividing the wafer into individual chips by applying to the wafer a laser beam of such a wavelength as to be absorbed in the wafer. The adhesive tape contains a substance that emits plasma light different from plasma light emitted by the wafer upon application of a laser beam thereto.

According to the wafer processing method of the present invention, whether or not complete cutting of a wafer by a laser beam has been made can be constantly monitored based on plasma light, so that complete cutting of the wafer can be efficiently performed by, for example, adjusting the output of the laser beam when the cutting has been incomplete.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
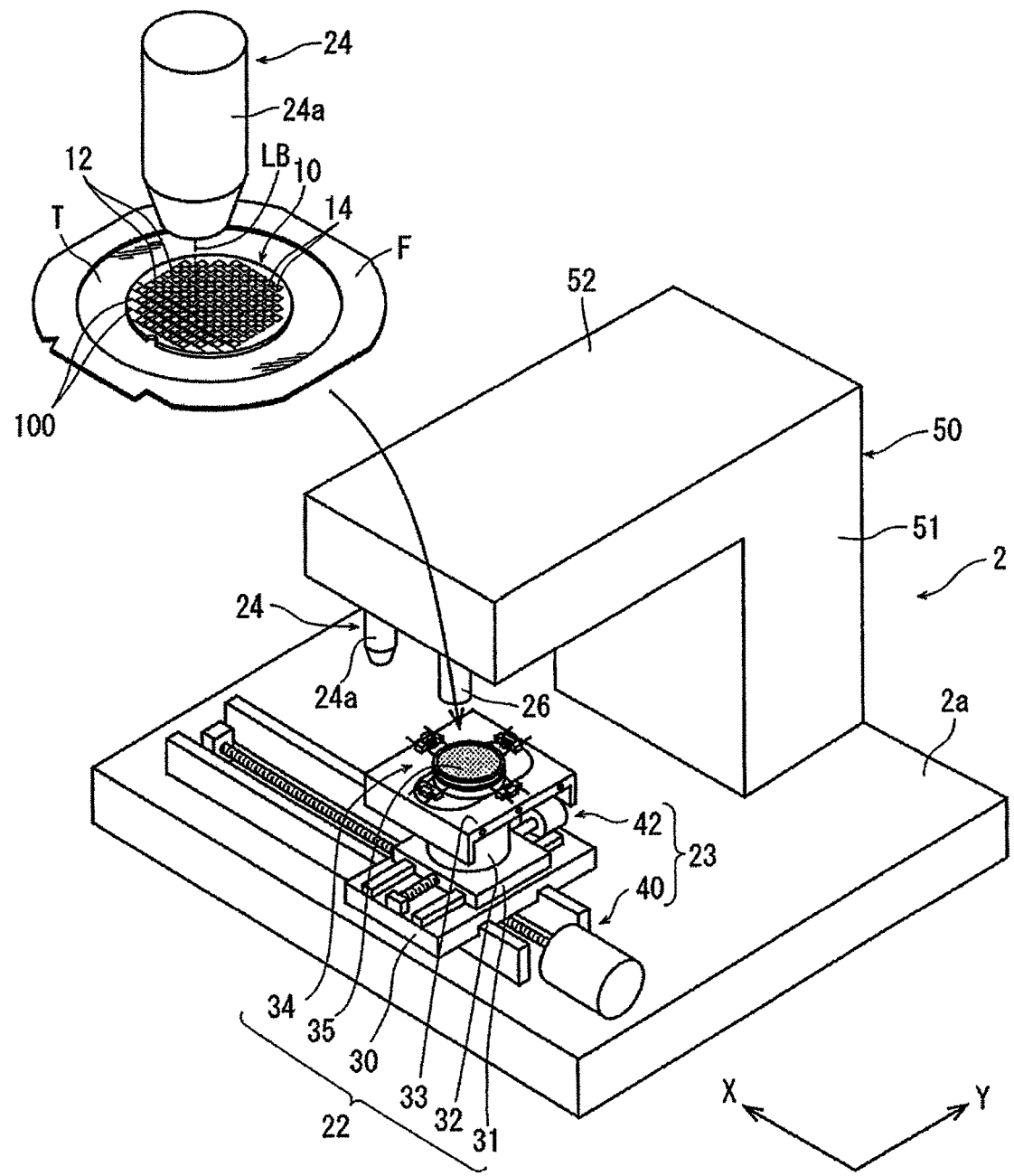
FIG. 1 is a perspective view of a laser processing apparatus and a wafer supported by an annular frame through an adhesive tape.

A wafer processing method and an adhesive tape which are configured based on the present invention will be described in detail below, referring to the attached drawings. FIG. 1 depicts a general perspective view of a laser processing apparatus 2 suitable for carrying out the wafer processing method configured based on the present invention. The laser processing apparatus 2 includes: holding means 22 for holding a workpiece; moving means 23 that is disposed on a stationary base 2a and moves the holding means 22; laser beam applying means 24 for applying a laser beam to the workpiece held by the holding means 22; and a frame body 50 including a vertical wall section 51 erected on the stationary base 2a on a lateral side of the moving means 23, and a horizontal wall section 52 extending horizontally from an upper end portion of the vertical wall section 51. In the inside of the horizontal wall section 52 of the frame body 50, an optical system of the laser beam applying means 24 constituting a main part of the laser processing apparatus 2 of the present invention is incorporated, and its configuration will be described in detail later. Note that the holding means 22 holds a workpiece (wafer 10) held by an annular frame F through an adhesive tape T depicted in an enlarged form on the left upper side in the figure.

The holding means 22 includes: a rectangular X-direction movable plate 30 mounted on the base 2a so as to be movable in an X-direction indicated by arrow X in the figure; a rectangular Y-direction movable plate 31 mounted on the X-direction movable plate 30 so as to be movable in a Y-direction indicated by arrow Y in the figure; a cylindrical support column 32 fixed on an upper surface of the Y-direction movable plate 31; and a rectangular cover plate 33 fixed to an upper end of the support column 32. On the cover plate 33 is disposed a chuck table 34 that extends upward through a slot formed on the cover plate 33, holds a circular workpiece, and is rotatable by rotary drive means (not depicted). On an upper surface of the chuck table 34 is disposed a circular suction chuck 35 that is formed from a porous material and extends substantially horizontally. The suction chuck 35 is connected to suction means (not depicted) via a passage passing through the support column 32. Note that the X-direction is the direction indicated by arrow X in FIG. 1, and the Y-direction is the direction indicated by arrow Y and orthogonal to the X-direction. A plane defined by the X-direction and the Y-direction is substantially horizontal.

The moving means 23 includes X-direction moving means 40 and Y-direction moving means 42. The X-direction moving means 40 converts a rotational motion of a motor into a rectilinear motion through a ball screw and transmits the rectilinear motion to the X-direction movable plate 30, thereby advancing and retracting the X-direction movable plate 30 in the X-direction along guide rails on the base 2a. The Y-direction moving means 42 converts a rotational motion of a motor into a rectilinear motion through a ball screw and transmits the rectilinear motion to the Y-direction movable plate 31, thereby advancing and retracting the Y-direction movable plate 31 in the Y-direction along guide rails on the X-direction movable plate 30. Note that though not depicted in the figure, the X-direction moving means 40 and the Y-direction moving means 42 are each provided with position detection means, whereby the position in the X-direction, the position in the Y-direction and the rotational position in the circumferential direction of the chuck table 34 are detected accurately, and the X-direction moving means 40, the Y-direction moving means 42 and the rotary drive means (not depicted) are driven based on a signal commanded from control means to be described later, so that the chuck table 34 can be accurately positioned in an arbitrary position and at an arbitrary angle.

As depicted in FIG. 1, the wafer 10 has a plurality of devices 14 formed on its front surface partitioned by division lines (streets) 12, and is held on the chuck table 34 in the state of being supported by the annular frame F through the adhesive tape T. While a laser beam LB of such a wavelength as to be absorbed in the wafer 10, formed of Si, is being applied to the wafer 10 from a focusing unit 24a by operating the laser beam applying means 24, the X-direction moving means 40 and the Y-direction moving means 42 are operated, to apply ablation processing to the division lines 12, thereby forming division starting points.

Figure 2:
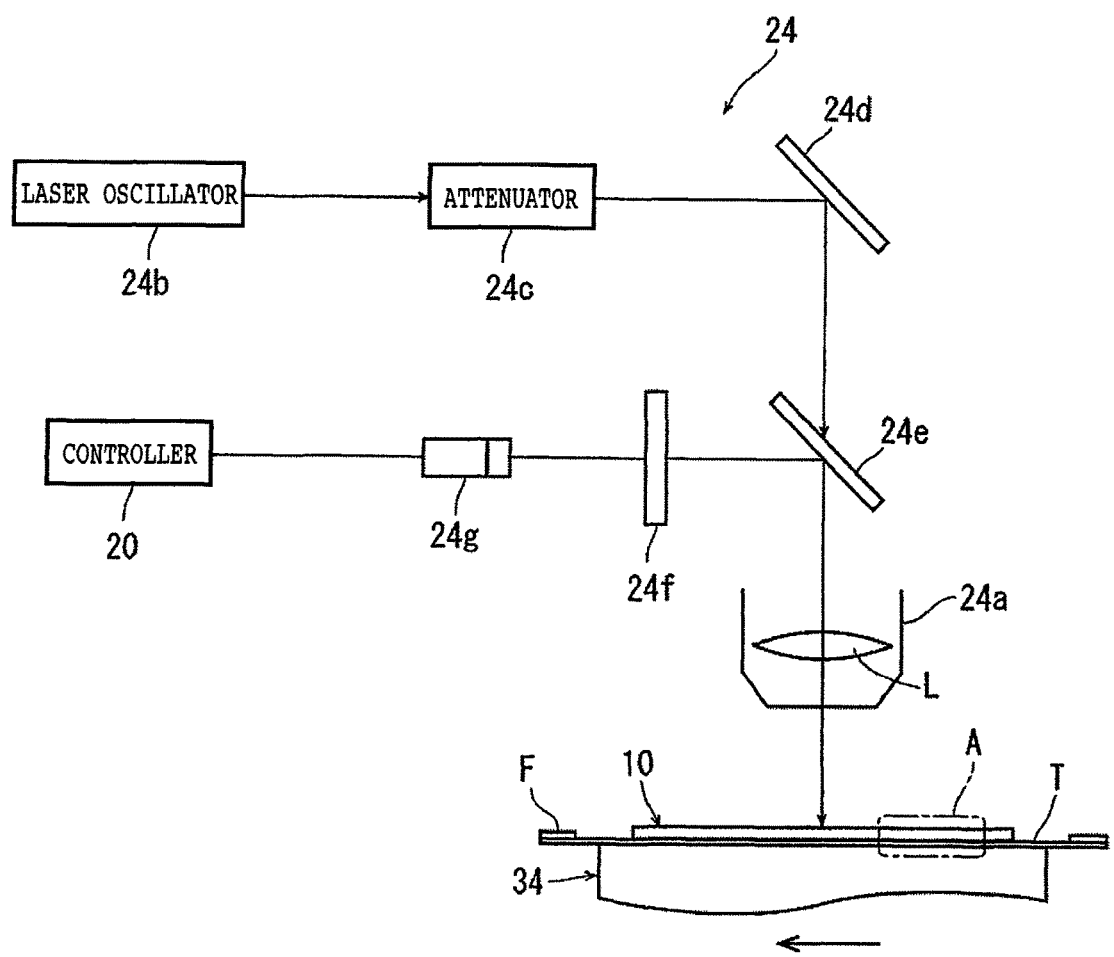
FIG. 2 is a block diagram for generally explaining laser beam applying means of the laser processing apparatus depicted in FIG. 1.

The laser beam applying means 24 configured to realize the wafer processing method of the present invention will be described more in detail, based on FIG. 2. The laser beam applying means 24 includes a laser oscillator 24b for oscillating a laser beam of a wavelength of 355 nm such as to be absorbed in the wafer 10 (formed of Si) and for applying the laser beam to the wafer 10 via the focusing unit 24a. The laser beam oscillated from the laser oscillator 24b is incident on an attenuator 24c that controls the output of the laser beam by regulating transmittance. The laser beam controlled to a desired output by the attenuator 24c is changed in direction by a reflective mirror 24d that changes the direction of the laser beam toward the wafer 10 side. The laser beam changed in direction by the reflective mirror 24d is transmitted through a dichroic mirror 24e permitting transmission therethrough of only wavelengths of 350 to 360 nm, and is applied to a predetermined position of the wafer 10 held on the chuck table 10, through a focusing lens L of the focusing unit 24a. Note that the focusing lens can be composed of an assembly obtained by appropriately combining a plurality of lenses.

Light emitted from the chuck table 34 side travels backward through the focusing unit 24a, and light of wavelengths other than 350 to 360 nm is reflected by the dichroic mirror 24e. On an optical path of the light reflected by the dichroic mirror 24e, there are disposed a band pass filter 24f permitting transmission therethrough of only light in a predetermined wavelength region (for example, 390 to 400 nm), and a photodetector 24g for measuring the quantity of the light transmitted through the band pass filter 24f. Then, the quantity of light measured by the photodetector 24g is outputted to the control means (controller) 20 disposed for controlling each of the means of the laser processing apparatus 2.

The control means 20 is composed of a computer, which includes a central processing unit (CPU) that performs arithmetic operations according to a control program, a read only memory (ROM) for storing the control program and the like, a writable-and-readable random access memory (RAM) for momentarily storing the detected value, operation results and the like, an input interface, and an output interface (detailed illustration is omitted). The control means 20 is for controlling various kinds of means disposed in the laser processing apparatus, and performs also control of the laser oscillator 24b and the attenuator 24c of the laser beam applying means 24.

Figure 3A:
FIG. 3A is an enlarged sectional view of a part dented by symbol A in the laser beam applying means depicted in FIG. 2.

The adhesive tape T for supporting the wafer 10 will be described in detail, referring to FIG. 3A. FIG. 3A depicts a partial enlarged sectional view of a part indicated by dotted line A in FIG. 2 in this embodiment. The adhesive tape T is composed of a sheet tb formed from polyolefin, polyethylene terephthalate, polyvinyl chloride or the like, and a rubber-based or acrylic glue layer (adhesive layer) ta formed on the sheet tb, and the wafer 10 is attached to and supported on the glue layer ta. The material forming the glue layer ta includes a fine powder in which, for example, aluminum (Al) is kneaded and uniformly dispersed, and thus the glue layer ta is formed on the sheet tb. When a laser beam of a wavelength of 355 nm is applied to the glue layer ta, plasma light of a wavelength of 396.15 nm is generated, since the fine powder of Al is kneaded in the glue layer ta.

Note that processing conditions at the time of laser processing by the laser processing apparatus aforementioned are set, for example, as follows.

Wafer: Si wafer
Laser wavelength: 355 nm
Average output: 3.0 W
Repetition frequency: 30 kHz
Focused spot diameter: 10 μm
Processing feed speed: 100 mm/second The laser processing apparatus 2 in this embodiment is generally configured as above. Operation or effect of the wafer processing method of the present invention that is carried out by the laser processing apparatus 2 will be described below.

In carrying out the wafer processing method configured based on the present invention, first, an adhesive tape attaching step of attaching the wafer 10 to the adhesive tape T, which emits plasma light different from plasma light emitted from the wafer 10 upon application of a laser beam thereto, is conducted. The wafer 10 in this embodiment is formed from Si (silicon), and when a laser beam of a wavelength (355 nm) such as to be absorbed in Si is applied to the wafer 10, plasma light of a wavelength of 251.61 nm is emitted, whereas when the laser beam is applied to the adhesive tape T, plasma light of a wavelength of 396.15 nm is generated.

When the adhesive tape attaching step has performed as above-mentioned, a holding step of holding the wafer 10 onto the chuck table 34 is carried out. More specifically, the wafer 10 is placed on the chuck table 34 of the laser beam processing apparatus 2 depicted in FIG. 1, with the adhesive tape T side on the lower side, the suction means (not depicted) is operated to suction hold the wafer 10 through the suction chuck 35, with the wafer 10 in an upwardly exposed state, and the annular frame F is fixed by clamping with clamps or the like.

When the holding step has been performed, a dividing step of dividing the wafer into individual chips is carried out. In conducting the dividing step, first, an alignment is conducted in which a processing region (division line 12) of the wafer 10 and a laser beam applying position of the focusing unit 24a of the laser beam applying means 24 are aligned, by use of imaging means 26 for imaging the processing region of the wafer 10.

After the alignment is performed, the chuck table 24 is moved to position the laser beam applying position at one end of the division line 12. Then, under the above-mentioned laser processing conditions, specifically, while a laser beam of a wavelength (355 nm) such as to be absorbed in the wafer 10 is being focusedly applied to a surface position of the wafer 10 by the focusing unit 24a of the laser beam applying means 24, the moving means 23 is operated to move the chuck table 34 at a predetermined processing feed speed in the direction indicated by arrow X. In this instance, in the present invention, a plasma light detection step is carried out to determine whether or not complete division of the wafer 10 has been made, while applying the laser beam. The plasma light detection step will be described more in detail, referring to FIG. 4.

Figure 4:
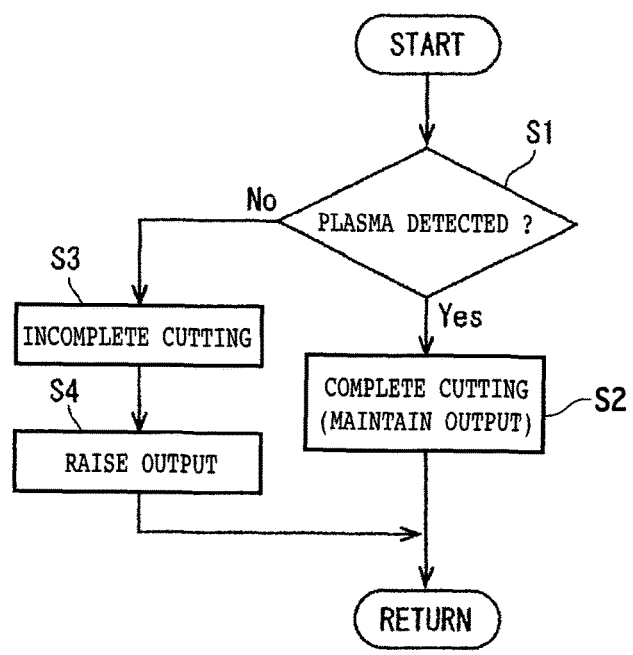
FIG. 4 is a flow chart of a control program for carrying out a wafer processing method of the present invention.

The plasma light detection step is carried out by the control program stored in the control means 20. A flow chart of the control program is depicted in FIG. 4. The control program depicted in the flow chart in FIG. 4 is executed repeatedly every predetermined time (several milliseconds), and is carried out continuedly when the dividing step is performed.

When the dividing step is started, as aforementioned, a laser beam is applied to the wafer 10 from the focusing unit 24a of the laser beam applying means 24. The output of the laser beam applied from the laser oscillator 24b of the laser beam applying means 24 is preliminarily set to such an extent as to completely divide the wafer 10 and to slightly process the adhesive tape T that supports the wafer 10. However, the laser beam is not necessarily applied at a fixed output, since the output may be varied due to minute variations in the output of the laser beam oscillated from the laser oscillator 24b or various disturbances. Therefore, the output of the laser beam at the time of starting the laser processing is preferably set at a value slightly lower than the output at which the wafer 10 is completely divided, in order to prevent the laser beam from being applied at an excessive output.

Referring to the flow chart in FIG. 4, while the laser beam of a wavelength of 355 nm is applied to Si constituting the wafer 10, plasma light of a wavelength of 251.61 nm is generated. Therefore, the plasma light reflected by the dichroic mirror 24e is not transmitted through a band pass filter 24f that permits transmission therethrough of only light in a wavelength region of 390 to 400 nm, so that the plasma light is not measured by the photodetector 24g. For this reason, the result of determination at step S1 is "No," the control therefore proceeds to step S3, where it is determined that incomplete cutting has been generated, the control proceeds to step S4, where a command to raise the output is sent to the attenuator 24c such that the laser beam output is raised by a predetermined width.

When the laser beam has been controlled to a necessary output and the wafer 10 has been completely cut, the laser beam reaches the adhesive tape T, to react with Al kneaded in the glue layer to located on the wafer 10 side of the adhesive tape T, resulting in generation of plasma light of a wavelength of 396.15 nm. This plasma light is transmitted through the band pass filter 24f, to be detected by the photodetector 24g. Therefore, the plasma light is detected and the result of determination at step S1 is "Yes," the control therefore proceeds to step S2, where it is determined that complete dividing has been made and that the output of the laser beam applied has been controlled to a sufficient value, so that the output control at the attenuator 24c is maintained. This control program is executed repeatedly during the laser processing, and, when it is again determined that incomplete cutting has been generated due to disturbance or the like, the control of raising the output is conducted. Note that in order to realize such a control as to slightly cut the adhesive tape T supporting the wafer 10 and to leave the remaining tape part uncut while performing complete cutting of the wafer 10, the laser beam output may be gradually lowered bit by bit when determination "No" is not made at step S1 for a predetermined time. In that case, at the time when the laser beam output becomes lower than the output for complete cutting of the wafer 10, namely, when the plasma light comes not to be detected at step S1, the laser beam output is again raised, and desired complete cutting is maintained thereby.

The dividing step is carried out while performing the plasma light detection step as aforementioned, and, when the other end of the division line 12 has reached the applying position of the focusing unit 24a, the application of the laser beam is stopped, and the movement of the chuck table 34 is stopped. As a result, a dividing groove 100 is formed along a predetermined division line 12 of the wafer 10.

When the dividing groove 100 has been formed ranging from one end to the other end of the predetermined division line 12 by the aforementioned laser processing, the holding means 22, the moving means 23 and the rotary drive means (not depicted) are operated to move the chuck table 34, and, while changing the position of the wafer 10 relative to the focusing unit 24a, similar processing is applied in regard of the remaining division lines 12, whereby the dividing grooves 100 are formed along all the division lines 12 of the wafer 100. Since the present invention has the abovementioned configuration, it is thereby possible to constantly confirm whether or not complete division along the division line 12 of the wafer 10 has been realized, and an appropriate measure can be taken such that the desired dividing grooves 100 can be obtained.

Figure 3B:
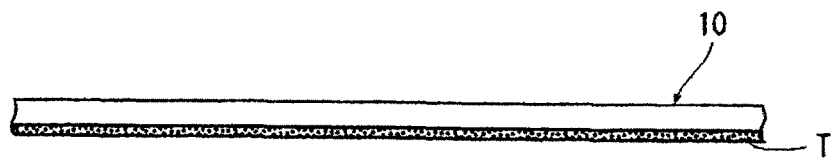
FIG. 3B is an enlarged sectional view of part A where an adhesive tape is attached in another embodiment.

The present invention is not limited to the above-described embodiment, and various modifications can be assumed so long as they fall within the technical scope of the invention. In the above embodiment, the adhesive tape T to which the wafer 10 is to be attached has been composed of the glue layer ta and the sheet tb as depicted in FIG. 3A, and a fine powder for generating plasma light different from that generated by the wafer 10 upon application of a laser beam thereto has been kneaded into the glue layer ta, but this is not restrictive. For example, as depicted in FIG. 3B, a fine powder for generating plasma light different from that generated by the wafer 10 may be kneaded into polyolefin, polyethylene terephthalate, polyvinyl chloride or the like constituting the adhesive tape T, in forming the adhesive tape T.

In the above embodiment, a fine powder of Al has been selected as the fine powder for generating plasma light different from that generated by the wafer 10 and been kneaded into the glue layer ta of the adhesive tape T, this is not restrictive of the present invention. In the case where the material constituting the wafer 10 is Si, for generating plasma light different from the plasma light of a wavelength of 251.61 nm and a wavelength of 288.16 nm, a fine powder selected from among fine powders of the following materials, for example, may be selected and kneaded. Note that the wavelengths of the plasma light generated when the following materials are selected and a laser beam of a wavelength of 355 nm is applied to the adhesive tape T are depicted on the right side. The material of the fine powder to be kneaded in the adhesive tape T is not limited to the following materials, and selections of materials different from the following materials are not to be excluded.

| <Fine powder material> | <Wavelength of plasma light> |
|---|---|
| Au | 400 nm, 250 nm |
| Cu | 282 nm, 324.75 nm |
| Fe | 259.96 nm, 296.69 nm, 371.99 nm 404.48 nm |
| Ti | 365.35 nm |

In the case where a fine powder of Au is selected as the fine powder to be kneaded into the adhesive tape T, plasma light of a wavelength of 250 nm is generated upon application of a laser beam to the adhesive tape T. If the wavelength to be detected by transmission through a band pass filter 24f is set to a value in the vicinity of 250 nm, therefore, plasma light generated from Si would also be transmitted through the band pass filter 24f, so that it may be impossible to determine whether or not complete cutting has been made.

In such a case, it is sufficient to set the wavelength to be transmitted through the band pass filter 24f to a value in the vicinity of 400 nm. In addition, while the above embodiment has been described by taking as an example a case where the material of the wafer 10 is Si, in the case where other material is selected as the material constituting the wafer 10 and plasma light of other wavelength is generated, the material of the fine powder to be kneaded into the adhesive tape T is selected taking into account the wavelength of the plasma light generated from the wafer 10. Note that candidates of the material of the fine powder for generating plasma light upon application of a laser beam thereto include Na (wavelength: 589 nm) or K (404.41 nm), but Na and K are not preferable because they may contaminate devices formed on the wafer 10 upon application of a laser beam thereto.

In the above embodiment, a configuration has been adopted in which the output of the laser beam applied to the wafer 10 is controlled according to the control program stored in the control means 20 while detecting the plasma light in the plasma light detection step, but the present invention is not limited to this configuration. A configuration may be adopted in which when it is confirmed during execution of the laser processing that complete division of the wafer 10 has not been made, the operator is informed of this situation by, for example, displaying an alert on a display screen (not depicted), and the operator himself or herself performs an output controlling operation, as required.

The present invention is not limited to the details of the above described preferred embodiments. The scope of the invention is defined by the appended claims and wall changes and modifications as fall within the equivalence of the scope of the claims are therefore to be embraced by the invention.

What is claimed is:

1. A wafer processing method for dividing a wafer into individual chips by applying to the wafer a laser beam having such a wavelength as to be absorbed in the wafer, the laser processing method comprising:
   an adhesive tape attaching step of attaching the wafer to an adhesive tape that emits plasma light different from plasma light emitted by the wafer upon application of a laser beam thereto;
   a holding step of holding the adhesive tape side on a chuck table so as to expose the wafer, after performing the adhesive tape attaching step;
   a dividing step of dividing the wafer while relatively moving the chuck table and the laser beam, after performing the holding step; and
   a plasma light detection step of detecting plasma light generated at the time of the dividing step,
   wherein in the plasma light detection step, complete division of the wafer is confirmed by detecting plasma light generated upon application of the laser beam to the adhesive tape.

2. The wafer processing method according to claim 1, wherein an output of the laser beam is raised when the plasma light from the adhesive tape cannot be detected in the plasma light detection step.

3. The wafer processing method according to claim 1, wherein the adhesive tape is formed to contain a fine powder that generates plasma light different from plasma light generated when the laser beam is applied to the wafer.

4. The wafer processing method according to claim 3, wherein the adhesive tape is comprised of a glue layer and a sheet, and, in the case where the wafer is a Si wafer that generates plasma light of a wavelength of 251.61 nm, a fine powder of a material selected from the group consisting of Al, Cu, Fe, Ti and Ni is mixed in the glue layer or the sheet of the adhesive tape.

\* \* \* \* \*